(12) United States Patent
Bendotti et al.

(10) Patent No.: US 12,095,603 B2
(45) Date of Patent: Sep. 17, 2024

(54) ISOLATED DRIVER DEVICE AND METHOD OF TRANSMITTING INFORMATION IN AN ISOLATED DRIVER DEVICE

(71) Applicant: STMicroelectronics S.r.l., Agrate Brianza (IT)

(72) Inventors: Valerio Bendotti, Vilminore di Scalve (IT); Valerio Gennari Santori, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/146,872

(22) Filed: Dec. 27, 2022

(65) Prior Publication Data

US 2023/0216717 A1 Jul. 6, 2023

(30) Foreign Application Priority Data

Jan. 3, 2022 (IT) .................. 102022000000014

(51) Int. Cl.
*H04L 27/20* (2006.01)
*H03K 19/20* (2006.01)
(Continued)

(52) U.S. Cl.
CPC ............. *H04L 27/20* (2013.01); *H03K 19/20* (2013.01); *H04B 1/0466* (2013.01); *H04B 1/16* (2013.01); *H04L 25/4902* (2013.01)

(58) Field of Classification Search
CPC ..... H04L 27/20; H04L 25/4902; H03K 19/20; H04B 1/0466; H04B 1/16; H04B 3/00;
(Continued)

(56) References Cited

U.S. PATENT DOCUMENTS 9,673,809 B1 * 6/2017 Kandah ............... H03K 17/691
2014/0328427 A1 * 11/2014 Chang .................... H05B 45/10
375/259

FOREIGN PATENT DOCUMENTS

EP 3447798 A2 2/2019
EP 3664270 A1 6/2020

* cited by examiner

*Primary Examiner* — Fitwi Y Hailegiorgis
(74) *Attorney, Agent, or Firm* — Seed IP Law Group LLP (57) ABSTRACT

An isolated driver device comprises a first semiconductor die and a second semiconductor die galvanically isolated from each other. The second semiconductor die includes a signal modulator circuit configured to modulate a carrier signal to produce a modulated signal encoding information. A galvanically isolated communication channel implemented in the first semiconductor die and the second semiconductor die is configured to transmit the modulated signal from the second semiconductor die to the first semiconductor die. The second semiconductor die includes: a fault detection circuit configured to detect electrical faults in the second semiconductor die; a logic circuit coupled to the fault detection circuit and configured to assert a modulation bypass signal in response to a fault being detected by the fault detection circuit; and modulation masking circuitry configured to force the modulated signal to a steady value over a plurality of periods of the carrier signal in response to the modulation bypass signal being asserted. The first semiconductor die includes a respective logic circuit sensitive to the modulated signal and configured to detect a condition where the modulated signal has a steady value over a plurality of periods of the carrier signal, and to assert a fault detection signal in response to the condition being detected.

19 Claims, 5 Drawing Sheets

(51) Int. Cl.
 *H04B 1/04* (2006.01)
 *H04B 1/16* (2006.01)
 *H04L 25/49* (2006.01)

(58) Field of Classification Search
 CPC ... H02M 3/33507; H02M 1/0006; H02M 1/08
 USPC .......................................................... 375/295
 See application file for complete search history.

ISOLATED DRIVER DEVICE AND METHOD OF TRANSMITTING INFORMATION IN AN ISOLATED DRIVER DEVICE

BACKGROUND

Technical Field

The description relates to isolated driver devices and methods of transmitting information (e.g., data) in an isolated driver device.

Isolated driver devices (e.g., gate driver devices) may be applied, for instance, in traction inverters, DC/DC converters, on-board chargers (OBC), and belt starter generators (BSG) for electric vehicles (EV) and hybrid electric vehicles (HEV).

Description of the Related Art

Conventional isolated gate driver devices comprise two semiconductor dies arranged in the same device package: a low voltage (LV) die that usually exchanges signals with an external control unit (e.g., a microcontroller), and a high voltage (HV) die that includes a driver circuit. The low voltage die and the high voltage die are electrically isolated one from the other by a galvanic isolation barrier that usually includes one or more high voltage rating capacitances (HVCap) arranged between the two dies.

Figure 1:
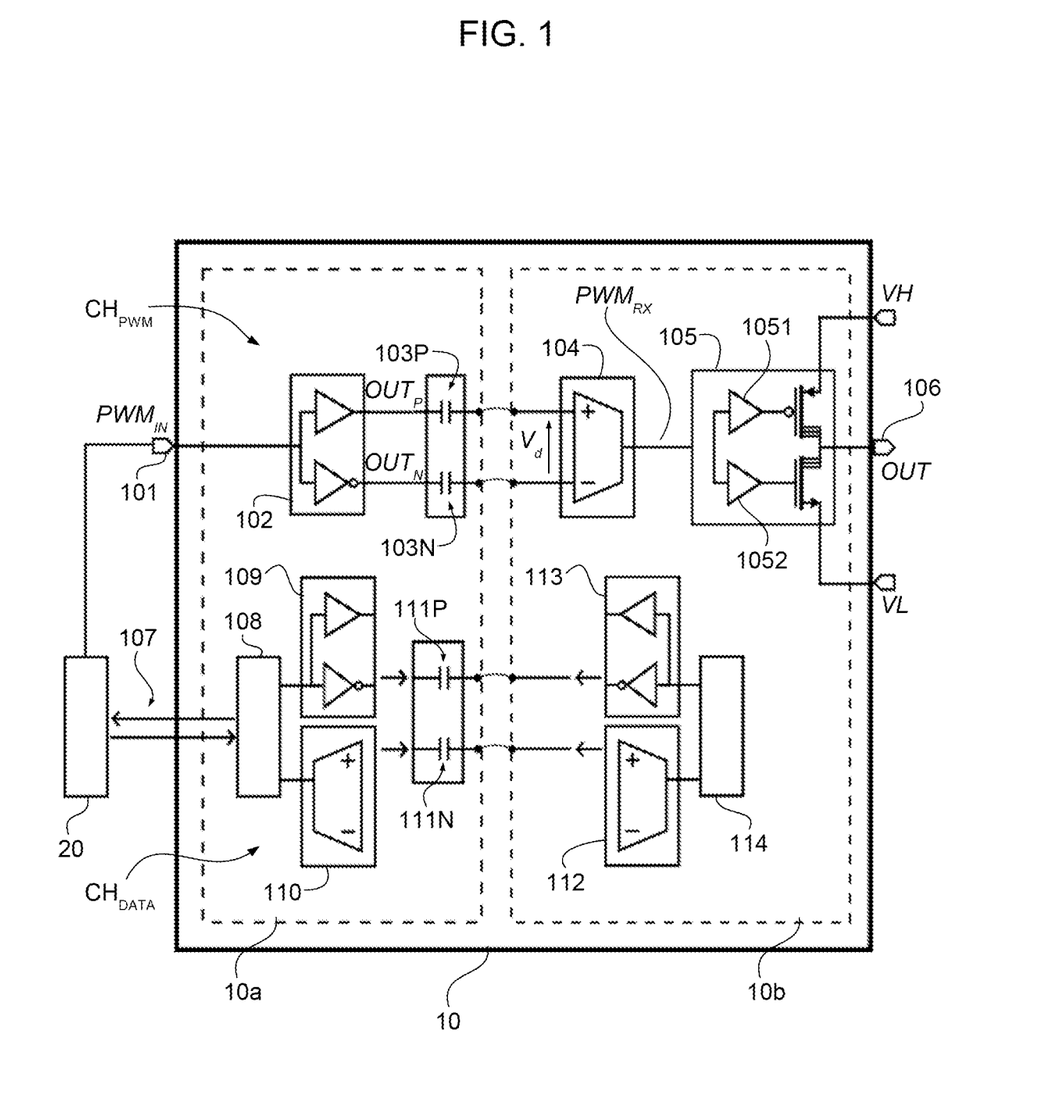
FIG. 1 is a circuit block diagram exemplary of an isolated driver device that has already been described in the foregoing.

FIG. 1 is a circuit block diagram exemplary of an isolated gate driver device 10 coupled to a microcontroller 20. The driver device 10 comprises a low voltage die 10a and a high voltage die 10b arranged in the same package. The driver device 10 comprises a control channel $CH_{PWM}$ (e.g., unidirectional) for transmitting a gate driving pulse-width modulated (PWM) signal from the low voltage die 10a to the high voltage die 10b, and a communication channel $CH_{DATA}$ (e.g., bidirectional) for exchanging an information signal (e.g., data signal) between the low voltage die 10a and the high voltage die 10b.

The control channel $CH_{PWM}$ comprises an input pin 101 configured to receive a pulse-width modulated input signal $PWM_{IN}$ (e.g., single-ended) from the microcontroller 20. The frequency of the input signal $PWM_{IN}$ may be, for instance, in the range of 15 kHz to 5 MHz. In the low voltage die 10a, the low voltage portion of the control channel $CH_{PWM}$ comprises a transmitter circuit 102 coupled to the input pin 101 and configured to convert the received PWM signal $PWM_{IN}$ into a pair of differential pulse-width modulated signals $OUT_P$, $OUT_N$. For instance, signal $OUT_P$ may be produced by a non-inverting buffer circuit that receives the input signal $PWM_{IN}$ at input, and signal $OUT_N$ may be produced by an inverting buffer circuit that receives the input signal $PWM_{IN}$ at input. The low voltage portion of the control channel $CH_{PWM}$ further comprises a first high voltage rating capacitance 103P (e.g., an isolation capacitor) having a first terminal coupled to a first output of the transmitter circuit 102 to receive signal $OUT_P$, and a second high voltage rating capacitance 103N (e.g., an isolation capacitor) having a first terminal coupled to a second output of the transmitter circuit 102 to receive signal $OUT_N$. The second terminals of the capacitances 103P and 103N provide the output nodes of the low voltage portion of the control channel $CH_{PWM}$, which are connected (e.g., via bonding wires) to the input nodes of the high voltage portion of the control channel $CH_{PWM}$ in the high voltage die 10b. The signals $OUT_P$, $OUT_N$ are filtered by the isolation capacitors 103P, 103N so that a pulsed differential signal $V_d$ reaches the high voltage portion of the control channel $CH_{PWM}$. The differential signal $V_d$ comprises a train of pulses (positive and negative) corresponding to the edges (rising and falling, respectively) of the input PWM signal $PWM_{IN}$.

The high voltage portion of the control channel $CH_{PWM}$ comprises a receiver circuit 104 coupled to the input nodes of the die 10b to receive the differential signal $V_d$, and configured to produce a reconstructed pulse-width modulated signal $PWM_{RX}$ as a function of the received differential signal $V_d$. For instance, the receiver circuit 104 may be configured to set the signal $PWM_{RX}$ to a high logic value ('1') as a result of a positive pulse being detected in the differential signal $V_d$, and to a low logic value ('0') as a result of a negative pulse being detected in the differential signal $V_d$. Therefore, the reconstructed signal $PWM_{RX}$ may substantially correspond to a (slightly) delayed copy of the transmitted signal $PWM_{IN}$. The high voltage portion of the control channel $CH_{PWM}$ comprises a driver stage 105 including a pre-driver circuit (e.g., buffers 1051 and 1052) configured to receive the reconstructed signal $PWM_{RX}$ and drive an output switching circuit as a function thereof. For instance, the output switching circuit may comprise a half-bridge driver stage comprising a high-side transistor and a low-side transistor arranged in series between a high voltage supply pin VH and a high voltage reference pin VL (e.g., ground) of the driver device 10. A node intermediate the high-side transistor and the low-side transistor may be electrically coupled to an output pin 106 of the driver device 10. The high-side transistor and the low-side transistor are driven by the pre-driver circuit so that an output switching signal OUT is produced at the output pin 106 (e.g., the high-side transistor is in a conductive state when $PWM_{RX}=0$ and the low-side transistor is in a conductive state when $PWM_{RX}=1$). The output switching signal OUT may be used, for instance, to control one or more insulated-gate bipolar transistors (IGBT), silicon carbide transistors (SiC MOSFET) and/or silicon transistors (Si MOSFET) in high-voltage motor control applications.

As exemplified in FIG. 1, the communication channel $CH_{DATA}$ comprises a bidirectional communication line 107 (e.g., a communication bus) configured to exchange one or more signals between the microcontroller 20 and the low voltage die 10a. In the low voltage die 10a, the low voltage portion of the communication channel $CH_{DATA}$ comprises a low voltage logic circuit 108 coupled to the communication bus 107 to receive, transmit and process signals from/to the microcontroller 20. The logic circuit 108 is coupled to a differential transmitter circuit 109 configured to transmit an information signal (e.g., data signal) towards the high voltage portion of the communication channel $CH_{DATA}$, and a differential receiver circuit 110 configured to receive an information signal (e.g., data signal) from the high voltage portion of the communication channel $CH_{DATA}$. The differential output of the transmitter circuit 109 and the differential input of the receiver circuit 110 are coupled to the first terminals of a pair of high voltage rating capacitances 111P and 111N (e.g., isolation capacitors). The second terminals of the capacitances 111P and 111N provide the input/output nodes of the low voltage portion of the communication channel $CH_{DATA}$, which are connected (e.g., via bonding wires) to the input/output nodes of the high voltage portion of the communication channel $CH_{DATA}$ in the high voltage die 10b.

The high voltage portion of the communication channel $CH_{DATA}$ comprises a differential receiver circuit 112 coupled to the input/output nodes of the die 10b and configured to receive the information signal from the low voltage portion of the communication channel $CH_{DATA}$, and a differential transmitter circuit 113 coupled to the input/output nodes of the die 10b and configured to transmit an information signal towards the low voltage portion of the communication channel $CH_{DATA}$. In the high voltage die 10b, the high voltage portion of the communication channel $CH_{DATA}$ comprises a high voltage logic circuit 114 coupled to the differential receiver circuit 112 and the differential transmitter circuit 113 to receive, transmit and process the information signal. Therefore, a complete integrated bidirectional communication channel $CH_{DATA}$ includes a transmission-receiver (TX-RX) differential interface and an isolation barrier (e.g., a pair of isolation capacitors 111P and 111N) between the two dies 10a and 10b.

As exemplified in FIG. 1, a control channel $CH_{PWM}$ can be mainly employed for transmitting a PWM gate control signal between the different voltage sections of the isolated driver device 10. Similarly, a data communication channel $CH_{DATA}$ can be mainly employed for transmitting an information signal between the different voltage sections of the isolated driver device 10. In some cases, a plurality of communication channels (not visible in FIG. 1) can be provided in an isolated driver device to implement additional functions.

A bidirectional communication protocol, which allows for data exchange between the two dies, can be used for overall device configuration, register readout and fault management. One of the information carried may thus regard the detection of faults.

In known devices, in the worst case scenario, if a failure event (e.g., a fault) occurs in the high voltage section (die 10b), the system has to wait for the end of an ongoing HV to LV data transmission and the subsequent LV to HV reverse data flow, before being able to use the communication channel $CH_{DATA}$ to communicate the detected fault to the external control unit 20. In high voltage systems, reacting rapidly on faults represents a desirable feature and a communication delay as described above may be undesirable.

Driver devices known in the art may provide a faster path for critical fault detection resorting to the use of an additional (e.g., autonomous or dedicated) HV-to-LV communication channel so as to bypass the bidirectional data flow interface protocol of a standard communication channel $CH_{DATA}$. However, that approach may involve the integration of an additional high voltage rating capacitance (e.g., an additional isolation capacitor) and related additional TX-RX circuitry, which result in larger silicon area occupation.

Therefore, there is a need in the art to provide improved isolated driver circuits that facilitate fast communication between the high voltage die and the low voltage die (e.g., for the purposes of fast fault detection) without increasing the silicon area occupation (e.g., without providing a dedicated unidirectional communication channel).

BRIEF SUMMARY

An object of one or more embodiments is to contribute in providing such improved isolated driver devices.

According to one or more embodiments, such an object can be achieved by an electronic device having the features set forth in the claims that follow.

One or more embodiments may relate to a corresponding method of transmitting information in an electronic device.

The claims are an integral part of the technical teaching provided herein in respect of the embodiments.

In one or more embodiments, an electronic device comprises a first semiconductor die (e.g., low voltage die) and a second semiconductor die (e.g., high voltage die) galvanically isolated from each other. The second semiconductor die includes a signal modulator circuit configured to modulate a carrier signal to produce a modulated signal encoding information. A galvanically isolated communication channel implemented in the first semiconductor die and the second semiconductor die is configured to transmit the modulated signal from the second semiconductor die to the first semiconductor die. The second semiconductor die includes a fault detection circuit configured to detect electrical faults in the second semiconductor die. The second semiconductor die further includes a logic circuit coupled to the fault detection circuit and configured to assert a modulation bypass signal in response to a fault being detected by the fault detection circuit. The second semiconductor die further includes modulation masking circuitry configured to force the modulated signal to a steady value over a plurality of periods of the carrier signal in response to the modulation bypass signal being asserted. The first semiconductor die includes a respective logic circuit sensitive to the modulated signal and configured to detect a condition where the modulated signal has a steady value over a plurality of periods of the carrier signal, and to assert a fault detection signal in response to the condition being detected.

One or more embodiments thus facilitate fast detection of faults in the second semiconductor die without resorting to a dedicated fault detection communication channel between the two semiconductor dies.

In one or more embodiments, the modulation bypass signal may be asserted-high, and the modulation masking circuitry may comprise an inverter circuit configured to produce the complement signal of the modulation bypass signal, and an AND logic gate configured to combine the complement signal of the modulation bypass signal and the modulated signal to force the modulated signal to a low logic value.

In one or more embodiments, the modulation bypass signal may be asserted-low, and the modulation masking circuitry may comprise an AND logic gate configured to combine the modulation bypass signal and the modulated signal to force the modulated signal to a low logic value.

In one or more embodiments, the modulation bypass signal may be asserted-low, and the modulation masking circuitry may comprise an inverter circuit configured to produce the complement signal of the modulation bypass signal, and an OR logic gate configured to combine the complement signal of the modulation bypass signal and the modulated signal to force the modulated signal to a high logic value.

In one or more embodiments, the modulation bypass signal may be asserted-high, and the modulation masking circuitry may comprise an OR logic gate configured to combine the modulation bypass signal and the modulated signal to force the modulated signal to a high logic value.

In one or more embodiments, the galvanically isolated communication channel may include a transmitter circuit implemented in the second semiconductor die, at least one isolation capacitor and a receiver circuit implemented in the first semiconductor die, and electrically conductive means coupling the transmitter circuit to the at least one isolation capacitor.

In one or more embodiments, the first semiconductor die may include a respective fault detection circuit configured to detect electrical faults in the first semiconductor die, and the respective logic circuit may be further configured to assert the fault detection signal in response to a fault being detected by the respective fault detection circuit.

In one or more embodiments, the carrier signal may be modulated according to a pulse-width modulation to produce the modulated signal encoding information.

In one or more embodiments, the modulation masking circuitry may be configured to force the modulated signal to a steady value for a duration of ten or less periods of the carrier signal, optionally five or less periods of the carrier signal, optionally four periods of the carrier signal, three periods of the carrier signal, or two periods of the carrier signal.

In one or more embodiments, the modulation masking circuitry may be configured to force the modulated signal to a steady value until the fault detection signal is asserted by the respective logic circuit.

In one or more embodiments, the electronic device may further comprise an input node configured to receive a pulse-width modulated control signal, and a second galvanically isolated communication channel implemented in the first semiconductor die and the second semiconductor die and configured to transmit the pulse-width modulated control signal from the first semiconductor die to the second semiconductor die. The second semiconductor die may include a driver circuit configured to receive the pulse-width modulated control signal and produce an output switching signal. The driver circuit may include a half-bridge circuit arranged between a positive supply voltage pin and a reference supply voltage pin. The modulated signal may encode a value of a supply voltage at the positive supply voltage pin.

In one or more embodiments, an electronic system may comprise a processing unit configured to generate a pulse-width modulated control signal, an electronic device according to one or more embodiments coupled to the processing unit to receive therefrom the pulse-width modulated control signal and to transmit thereto the fault detection signal, and a voltage regulator circuit configured to produce the supply voltage at the positive supply voltage pin.

In one or more embodiments, an electronic system may further comprise a capacitor coupled to the positive supply voltage pin.

In one or more embodiments, a method of transmitting information in an electronic device, wherein the electronic device comprises a first semiconductor die and a second semiconductor die galvanically isolated from each other, may comprise:
- modulating, at a signal modulator circuit of the second semiconductor die, a carrier signal to produce a modulated signal encoding information;
- transmitting the modulated signal from the second semiconductor die to the first semiconductor die via a galvanically isolated communication channel implemented in the first semiconductor die and the second semiconductor die;
- detecting, at a fault detection circuit of the second semiconductor die, electrical faults in the second semiconductor die;
- asserting, at a logic circuit of the second semiconductor die, a modulation bypass signal in response to a fault being detected by the fault detection circuit;
- forcing, at a modulation masking circuit of the second semiconductor die, the modulated signal to a steady value over a plurality of periods of the carrier signal in response to the modulation bypass signal being asserted;
- detecting, at a respective logic circuit of the first semiconductor die, a condition where the modulated signal a steady value over a plurality of periods of the carrier signal; and
- asserting, at the respective logic circuit of the first semiconductor die, a fault detection signal in response to the condition being detected.

BRIEF DESCRIPTION OF THE SEVERAL VIEWS OF THE DRAWINGS

One or more embodiments will now be described, by way of example only, with reference to the figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures herein, unless the context indicates otherwise, like parts or elements are indicated with like references/numerals and a corresponding description will not be repeated for the sake of brevity.

Figure 2:
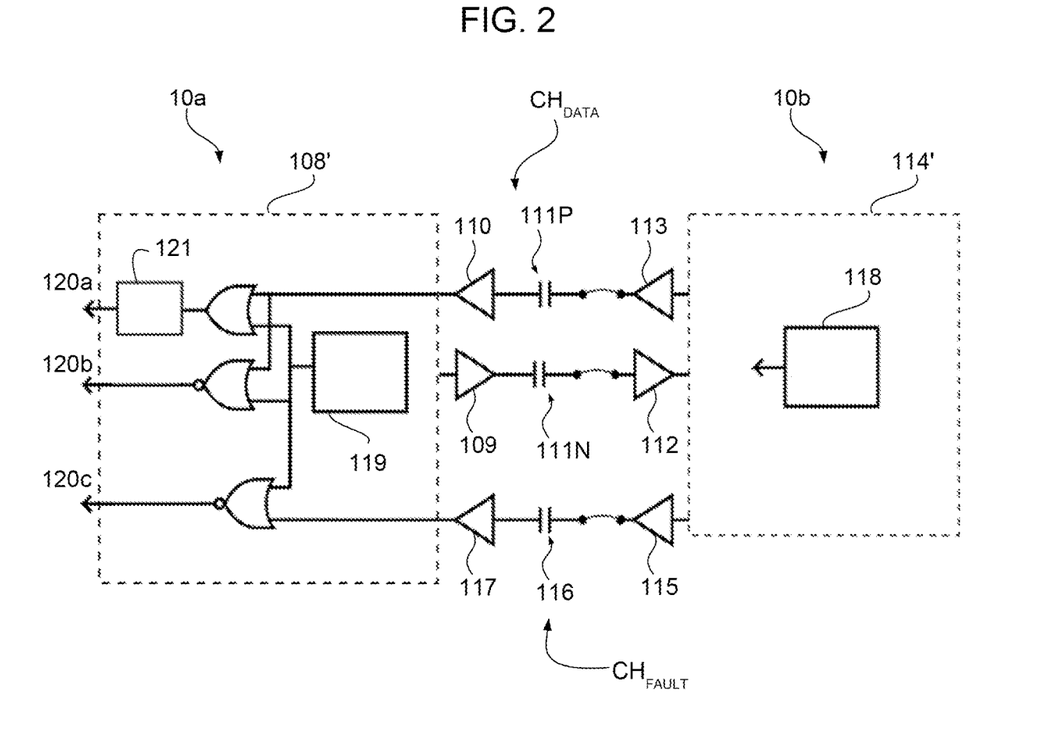
FIG. 2 is a circuit block diagram exemplary of communication channels in an isolated driver device.

By way of introduction to the detailed description of exemplary embodiments, reference may first be made to FIG. 2, which is a circuit block diagram exemplary of communication channels in an isolated driver device. In particular, FIG. 2 shows certain components of a conventional isolated driver device provided with a dedicated HV-to-LV unidirectional communication channel for fast detection of faults in the high voltage die 10b.

The low voltage die 10a comprises a low voltage digital circuit 108' (e.g., including the low voltage logic circuit 108) coupled to a bidirectional communication channel $CH_{DATA}$. The high voltage die 10b comprises a high voltage digital circuit 114' (e.g., including the high voltage logic circuit 114) coupled to the bidirectional communication channel $CH_{DATA}$. The bidirectional communication channel $CH_{DATA}$ includes a transmitter circuit 109, a receiver circuit 110, isolation capacitors 111P and 111N, a receiver circuit 112 and a transmitter circuit 113 as described with reference to FIG. 1. It is noted that the transmitter and receiver circuits 109, 110, 112 and 113 are illustrated as single-ended circuits for the sake of ease of illustration only, but they may include differential circuits as described with reference to FIG. 1.

Additionally, the driver device comprises a dedicated HV-to-LV unidirectional communication channel $CH_{FAULT}$ from the high voltage die 10b to the low voltage die 10a, the channel $CH_{FAULT}$ including a respective transmitter circuit 115 in the high voltage die 10b, and respective isolation capacitor(s) 116 and receiver circuit 117 in the low voltage die 10a. Again, the transmitter circuit 115, the receiver circuit 117 and the isolation capacitor(s) 116 are illustrated as single-ended circuits for the sake of ease of illustration only, but they may include differential circuits as described with reference to FIG. 1.

The high voltage digital circuit 114' may comprise a high voltage diagnosis circuit 118 configured to produce a fault signal indicative of a fault being detected in the high voltage die 10b (e.g., the fault signal being asserted in response to a detected fault). The fault signal may be transmitted via the bidirectional channel $CH_{DATA}$ and/or the unidirectional dedicated channel $CH_{FAULT}$. The low voltage digital circuit 108' may comprise a low voltage diagnosis circuit 119 configured to produce a respective fault signal indicative of a fault being detected in the low voltage die 10a (e.g., the respective fault signal being asserted in response to a detected fault).

A first output 120a of the low voltage digital circuit 108' may provide a serial data output (SDO) signal produced by a serial peripheral interface (SPI) 121 as a function of the data signal received from the communication channel $CH_{DATA}$ and the diagnosis signal produced by the diagnosis circuit 119, e.g., as an OR combination (OR logic gate) of the data signal and diagnosis signal. A second output 120b of the low voltage digital circuit 108' may provide a slow fault detection signal produced as a function of the data signal received from the communication channel $CH_{DATA}$ and the diagnosis signal produced by the diagnosis circuit 119, e.g., as a NOR combination (NOR logic gate) of the data signal and diagnosis signal. A third output 120c of the low voltage digital circuit 108' may provide a fast fault detection signal produced as a function of the data signal received from the unidirectional channel $CH_{FAULT}$ and the diagnosis signal produced by the diagnosis circuit 119, e.g., as a NOR combination (NOR logic gate) of the two signals.

Therefore, in a device as shown in FIG. 2, faults detected in the high voltage die 10b can be communicated to an external control unit via a slower communication path resorting to a bidirectional communication channel $CH_{DATA}$, and/or via a faster communication path resorting to a dedicated unidirectional communication channel $CH_{FAULT}$. In the latter case, the fault detection time may be as short as the TX-RX chain propagation delay. However, implementing a faster path $CH_{FAULT}$ for critical fault detection involves the use of a dedicated HV-to-LV channel in order to bypass the bidirectional interface data flow of channel $CH_{DATA}$, resulting in large silicon area occupation due to the integration of large high voltage capacitor(s) 116 (e.g., having a voltage rating in the order of some kV) and related TX-RX circuitry 115 and 117.

Instead of providing an additional, dedicated HV-to-LV communication channel CHFAULT, one or more embodiments may rely on the presence of other communication channel(s) that are often integrated for device-specific functions, other than communication and driver control.

Figure 3:
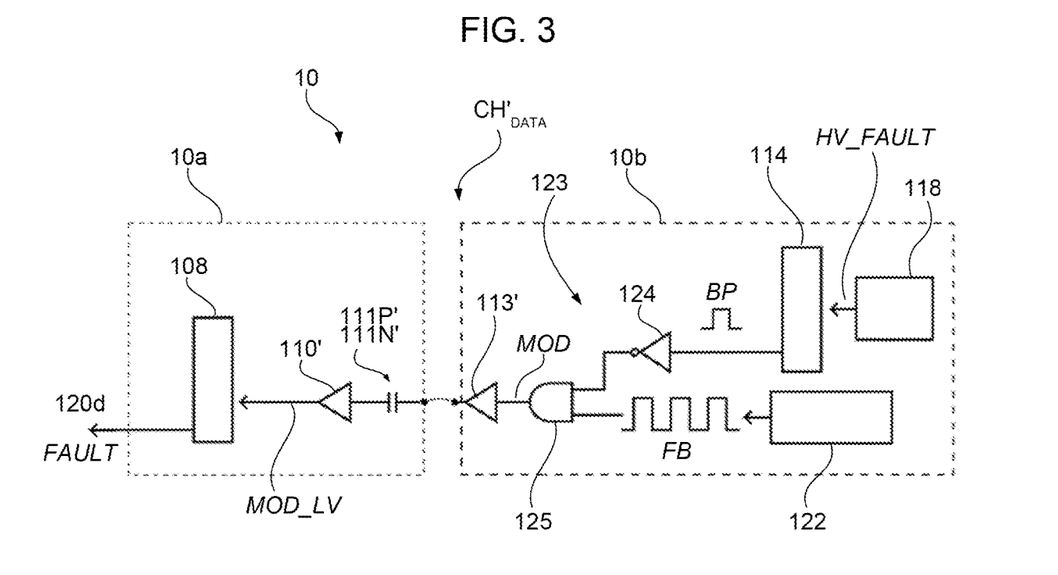
FIG. 3 is a circuit block diagram exemplary of a communication channel in an isolated driver device according to one or more embodiments of the present description.

As exemplified in FIG. 3, an isolated driver device 10 according to one or more embodiments may comprise a communication channel $CH'_{DATA}$ configured to transmit a modulated signal (e.g., a feedback signal, possibly modulated according to a PWM modulation) following the HV to LV data flow, i.e., from the high voltage die 10b to the low voltage die 10a. In one or more embodiments, in response to a fault being detected in the high voltage die 10b, a logical conditioning may be applied to the modulated signal to temporarily "mask" the modulated signal transmitted via the channel $CH'_{DATA}$. The low voltage logic circuit 108 may be configured to sense the "masking" (e.g., loss of information) of the modulated signal, and consequently assert a (fast) fault signal FAULT at an output 120d of the low voltage die 10a.

In one or more embodiments, such an approach to fast fault detection may be advantageous insofar as the temporary masking of the modulated signal (e.g., lack of information in the modulated signal) transmitted via the channel $CH'_{DATA}$ does not affect the operation of the device (e.g., does not affect other device specifications). A transparent reaction to fast masking transient of the channel $CH'_{DATA}$ can be modeled (e.g., implemented) as a low-pass filtering in the signal flow path.

Therefore, in one or more embodiments an isolated driver device 10 may comprise a high voltage die 10b and a low voltage die 10a electrically isolated by an isolation barrier, and a communication channel $CH'_{DATA}$ configured to transmit a modulated signal MOD (e.g., an information signal or a feedback signal) from the high voltage die 10b to the low voltage die 10a. The communication channel $CH'_{DATA}$ may be unidirectional (from the high voltage die to the low voltage die) or bidirectional, and may include a (differential) transmitter circuit 113' in the high voltage die 10b, as well as isolation capacitor(s) 111P', 111N' and a (differential) receiver circuit 110' in the low voltage die 10a.

Figure 4:
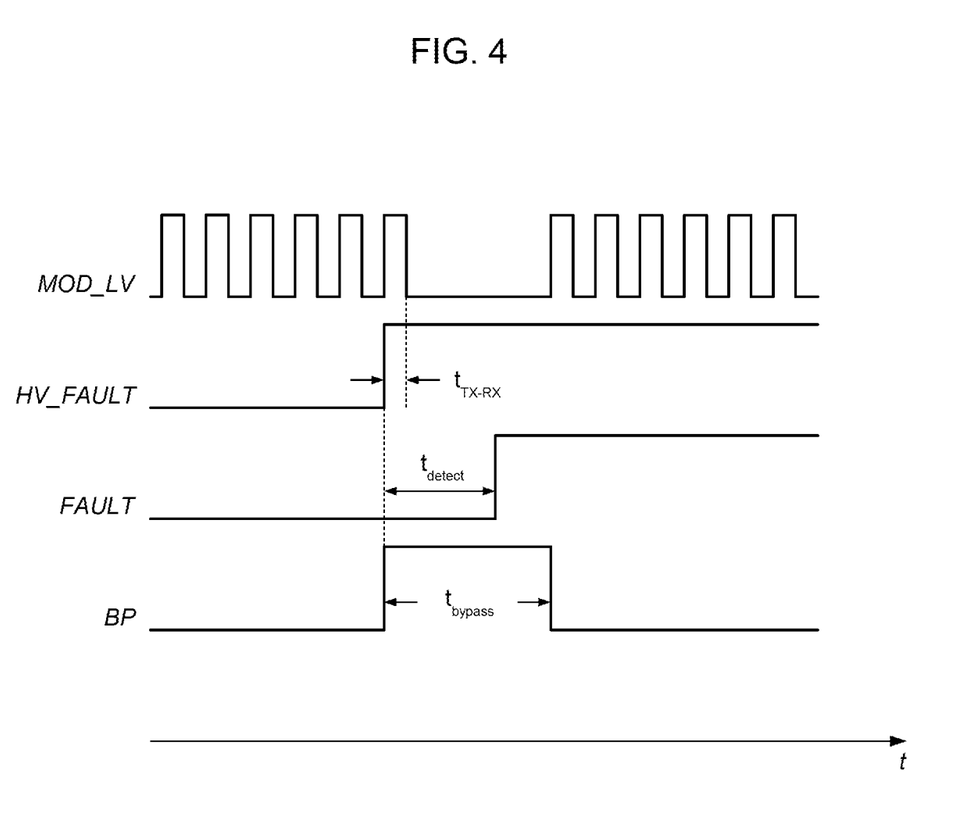
FIG. 4 is a time diagram exemplary of signals in a communication channel of an isolated driver device according to one or more embodiments of the present description.

As exemplified in FIGS. 3 and 4, the high voltage die 10b may comprise a signal modulator circuit 122 configured to produce a modulated signal FB carrying some sort of information (e.g., a feedback, a reading value from a sensor, and the like). The high voltage die 10b may further comprise a high voltage diagnosis circuit 118 coupled to a logic circuit 114. The diagnosis circuit 118 may be configured to assert a high-voltage fault signal HV_FAULT indicative of a fault being detected in the high voltage die 10b, and the logic circuit 114 may be configured to assert a signal BP (e.g., a modulation bypass signal) in response to the high-voltage fault signal HV_FAULT being asserted. The bypass signal BP may be kept asserted for a certain period of time (e.g., fixed or programmable) $t_{bypass}$, and may be de-asserted again at the end of the period of time $t_{bypass}$. The high voltage die 10b may comprise logic circuitry 123 configured to mask (e.g., set to a low logic value) the modulated signal FB in response to the bypass signal BP being asserted. For instance, if signal BP is asserted-high, the masking circuitry 123 may comprise an inverter circuit 124 configured to produce the complement of the bypass signal BP, and an AND gate 125 configured to combine the complement of the bypass signal BP and the modulated signal FB to produce the output modulated signal MOD, where the output modulated signal MOD is "masked" when forced to a low logic value over plural periods. Alternatively, the masking circuitry 123 may comprise an OR gate configured to combine the bypass signal BP and the modulated signal FB to produce the output modulated signal MOD, where the output modulated signal MOD is "masked" when forced to a high logic value over plural periods.

Therefore, the modulated signal MOD as received at the low voltage die 10a (e.g., signal MOD_LV) may include a portion (see FIG. 4) where the information content is masked and the signal is kept to the same logic value (e.g., low) over multiple periods. The logic circuit 108 in the low voltage die 10a may be configured to detect such loss of information in the modulated signal MOD_LV, and consequently assert the output fault signal FAULT at node 120d for transmission to the microcontroller 20. In order not to hinder operation of the device 10, the value of the modulated signals MOD and MOD_LV may be masked for a short period of time $t_{bypass}$ (e.g., one period, two periods, three periods, etc., up to five or ten periods). Additionally or alternatively, the value of the modulated signals MOD and MOD_LV may be masked until the fault signal FAULT produced by the logic circuit 108 and monitored by the microcontroller 20 is asserted (e.g., the modulated signal MOD may be de-masked as soon as the microcontroller 20 acknowledges detection of a fault). Overall, a short period of time $t_{detect}$ may be needed to assert the fault signal FAULT after detection of a fault in the high voltage die 10b.

Figure 5:
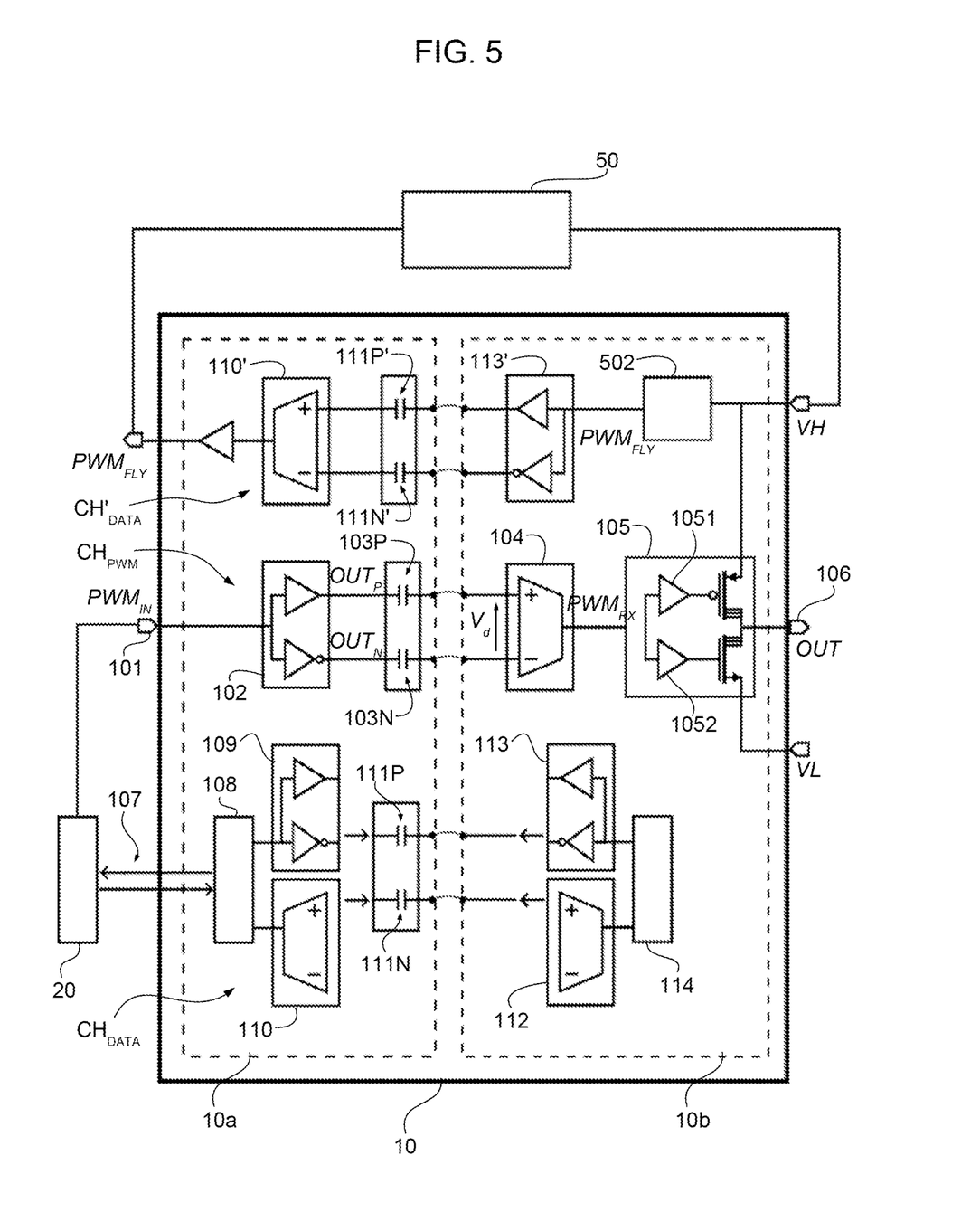
FIG. 5 is a circuit block diagram exemplary of an isolated driver device for use with a voltage regulator circuit, according to one or more embodiments of the present description.
Figure 6:
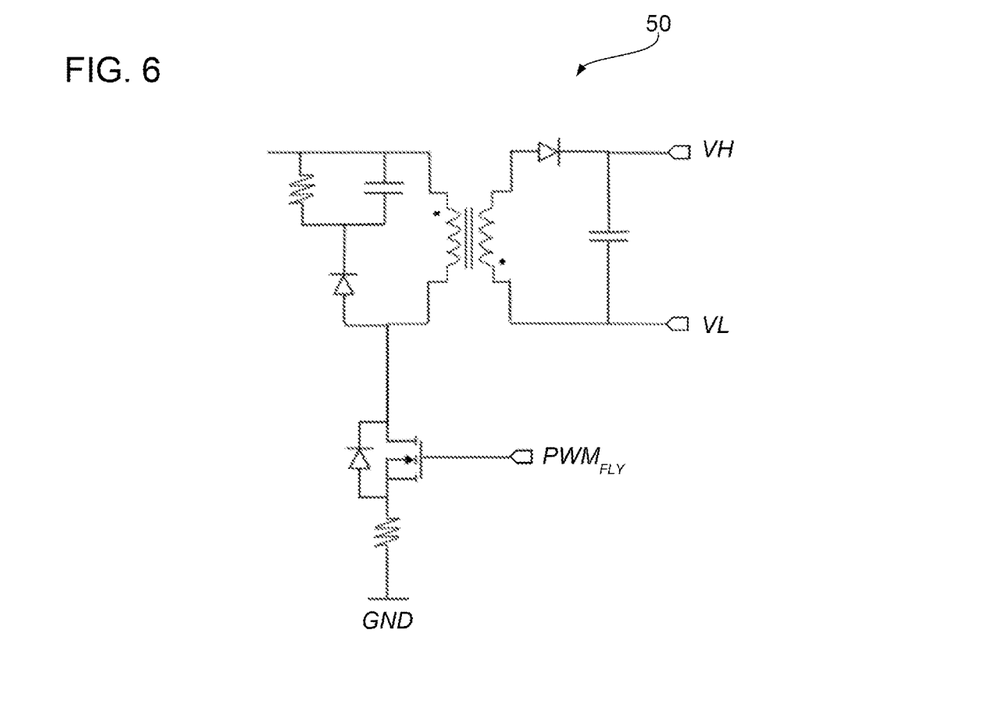
FIG. 6 is a circuit diagram exemplary of a flyback voltage regulator for use with an isolated driver device according to one or more embodiments of the present description.

FIGS. 5 and 6 are circuit block diagrams exemplary of a possible application of one or more embodiments. In particular, the isolated driver device 10 exemplified in FIG. 5 includes a bidirectional communication channel $CH_{DATA}$ and a unidirectional control channel $CH_{PWM}$ substantially as disclosed with reference to FIG. 1. Additionally, the isolated driver device 10 comprises a further (unidirectional, in the present example) communication channel $CH'_{DATA}$ configured to transmit a feedback signal from the high voltage die 10b to the low voltage die 10a. In particular, the communication channel $CH'_{DATA}$ is configured to regulate in a closed loop the positive supply rail VH generated by an isolated external flyback network 50 (or any other suitable DC-DC converter) for the high voltage driver stage 105. The secondary output of a transformer included in the flyback network 50, as exemplified in FIG. 6, may be sensed at the high voltage die 10b and the information about the voltage level of the positive supply rail VH can be encoded by modulating the duty-cycle of a fixed frequency PWM signal at a flyback control circuit 502, thereby producing a modulated feedback signal $PWM_{FLY}$. Fault detection circuitry 118 and masking circuitry 123 (not visible in FIG. 5 for the sake of ease of illustration) can be provided in the high voltage die 10b to act on the feedback signal $PWM_{FLY}$ and temporarily mask its value as a result of a fault being detected. As previously discussed, in order not to hinder operation of the device 10, the value of the feedback signal $PWM_{FLY}$ may be masked for a short period of time (e.g., one period, two periods, three periods, etc., up to five or ten periods). Additionally or alternatively, the value of the feedback signal $PWM_{FLY}$ may be masked until the fault signal FAULT produced by the logic circuit 108 in the low voltage die 10a and monitored by the microcontroller 20 is asserted.

Figure 7:
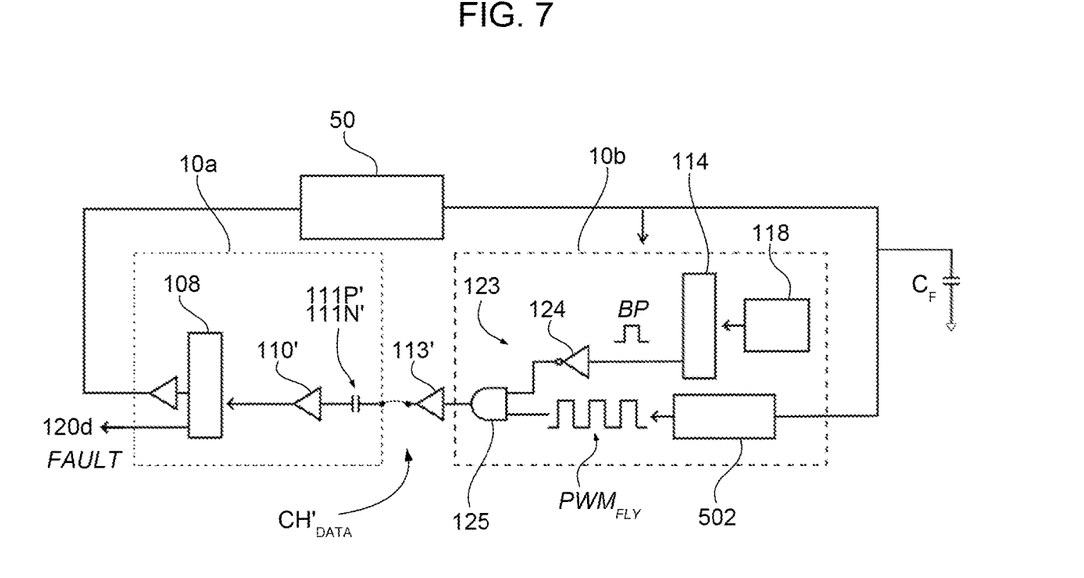
FIG. 7 is a circuit block diagram exemplary of a feedback communication channel in an isolated driver device according to one or more embodiments of the present description.

FIG. 7 is a further circuit block diagram that shows, in a simplified manner, the provision of fault detection circuitry and masking circuitry in a flyback feedback channel $CH'_{DATA}$ as discussed with reference to FIGS. 5 and 6. The flyback regulation feature (e.g., circuit 502) and the fast fault detection feature (e.g., circuits 118, 114, 123) may share the same communication channel $CH'_{DATA}$.

In one or more embodiments as exemplified in FIG. 7, since the fault detection and assertion mechanism may take place in a short time (e.g., a few microseconds), the temporary lack of information in the flyback feedback signal does not affect the output battery regulation (i.e., the voltage at rail VH), insofar as a rectification capacitor $C_F$ is coupled to the secondary winding of the flyback transformer.

It will be understood that one or more embodiments have been disclosed herein with reference to the case of a flyback voltage feedback channel used for transmission of the fault signal purely by way of example. Other embodiments may rely on the use of communication channels provided in the isolated driver device 10 for different purposes. Purely by way of additional example, the channel $CH'_{DATA}$ may be an information channel used mainly for transmitting information from a sensor to the microcontroller 20 via the low voltage die 10a (e.g., a temperature sensor or the like).

Therefore, one or more embodiments may rely on the use of a same communication channel $CH'_{DATA}$ for both a dedicated device function (e.g., flyback output regulation) and for HV-fault fast detection, thereby advantageously providing fast fault detection without increasing the silicon area occupation (e.g., because no extra high-voltage capacitor and related TX-RX channel circuitry has to be implemented).

Without prejudice to the underlying principles, the details and embodiments may vary, even significantly, with respect to what has been described by way of example only, without departing from the extent of protection.

An electronic device (10), may be summarized as including a first semiconductor die (10a); a second semiconductor die (10b) galvanically isolated from said first semiconductor die (10a), wherein the second semiconductor die (10b) includes a signal modulator circuit (122; 502) configured to modulate a carrier signal to produce a modulated signal (FB) encoding information; a galvanically isolated communication channel (113', 111P', 111N', 110') implemented in said first semiconductor die (10a) and said second semiconductor die (10b) and configured to transmit said modulated signal (FB) from the second semiconductor die (10b) to the first semiconductor die (10a); wherein the second semiconductor die (10b) includes: a fault detection circuit (118) configured to detect electrical faults in the second semiconductor die (10b); a logic circuit (114) coupled to the fault detection circuit (118) and configured to assert a modulation bypass signal (BP) in response to a fault being detected by the fault detection circuit (118); and modulation masking circuitry (123) configured to force said modulated signal (FB) to a steady value over a plurality of periods of said carrier signal in response to said modulation bypass signal (BP) being asserted; and wherein the first semiconductor die (10a) includes a respective logic circuit (108) sensitive to said modulated signal (FB, MOD) and configured to detect a condition where said modulated signal (FB) has a steady value over a plurality of periods of said carrier signal, and to assert a fault detection signal (FAULT) in response to said condition being detected.

Said modulation bypass signal (BP) may be asserted-high, and said modulation masking circuitry (123) may include an inverter circuit (124) configured to produce the complement signal of said modulation bypass signal (BP), and an AND logic gate (125) configured to combine the complement signal of said modulation bypass signal (BP) and said modulated signal (FB) to force said modulated signal (FB) to a low logic value.

Said modulation bypass signal (BP) may be asserted-low, and said modulation masking circuitry (123) may include an AND logic gate (125) configured to combine said modulation bypass signal (BP) and said modulated signal (FB) to force said modulated signal (FB) to a low logic value.

Said modulation bypass signal (BP) may be asserted-low, and said modulation masking circuitry (123) may include an inverter circuit (124) configured to produce the complement signal of said modulation bypass signal (BP), and an OR logic gate configured to combine the complement signal of said modulation bypass signal (BP) and said modulated signal (FB) to force said modulated signal (FB) to a high logic value.

Said modulation bypass signal (BP) may be asserted-high, and said modulation masking circuitry (123) may include an OR logic gate configured to combine said modulation bypass signal (BP) and said modulated signal (FB) to force said modulated signal (FB) to a high logic value.

Said galvanically isolated communication channel (113', 111P', 111N', 110') may include a transmitter circuit (113') implemented in said second semiconductor die (10b); at least one isolation capacitor (111P', 111N') and a receiver circuit (110') implemented in said first semiconductor die (10a); and electrically conductive means coupling said transmitter circuit (113') to said at least one isolation capacitor (111P', 111N').

The first semiconductor die (10a) may include a respective fault detection circuit (119) configured to detect electrical faults in the first semiconductor die (10a), and said respective logic circuit (108) may be further configured to assert said fault detection signal (FAULT) in response to a fault being detected by the respective fault detection circuit (119).

Said carrier signal may be modulated according to a pulse-width modulation to produce said modulated signal (FB) encoding information.

Said modulation masking circuitry (123) may be configured to force said modulated signal (FB) to a steady value for a duration ($t_{bypass}$) of ten or less periods of said carrier signal, preferably five or less periods of said carrier signal, more preferably four periods of said carrier signal, three periods of said carrier signal, or two periods of said carrier signal.

Said modulation masking circuitry (123) may be configured to force said modulated signal (FB) to a steady value until said fault detection signal (FAULT) is asserted by said respective logic circuit (108).

The electronic device (10) may further include an input node (101) configured to receive a pulse-width modulated control signal ($PWM_{IN}$); and a second galvanically isolated communication channel (102, 103P, 103N, 104) implemented in said first semiconductor die (10a) and said second semiconductor die (10b) and configured to transmit said pulse-width modulated control signal ($PWM_{IN}$) from the first semiconductor die (10a) to the second semiconductor die (10b); wherein said second semiconductor die (10b) may include a driver circuit (105) configured to receive said pulse-width modulated control signal ($PWM_{IN}$) and produce an output switching signal (OUT), the driver circuit (105) including a half-bridge circuit arranged between a positive supply voltage pin (VH) and a reference supply voltage pin (VL), and said modulated signal (FB) may encode a value of a supply voltage at said positive supply voltage pin (VH).

An electronic system, may be summarized as including a processing unit (20) configured to generate a pulse-width modulated control signal ($PWM_{IN}$); an electronic device (10) according to claim 11 coupled to the processing unit (20) to receive therefrom said pulse-width modulated control signal ($PWM_{IN}$) and to transmit thereto said fault detection signal (FAULT); and a voltage regulator circuit (50) configured to produce said supply voltage at said positive supply voltage pin (VH).

The electronic system may further include a capacitor ($C_F$) coupled to said positive supply voltage pin (VH).

A method of transmitting information in an electronic device (10), wherein the electronic device (10) may be summarized as including a first semiconductor die (10a) and a second semiconductor die (10b) galvanically isolated from each other, the method including modulating, at a signal modulator circuit (122; 502) of said second semiconductor die (10b), a carrier signal to produce a modulated signal (FB) encoding information; transmitting said modulated signal (FB) from the second semiconductor die (10b) to the first semiconductor die (10a) via a galvanically isolated communication channel (113', 111P', 111N', 110') implemented in said first semiconductor die (10a) and said second semiconductor die (10b); detecting, at a fault detection circuit (118) of said second semiconductor die (10b), electrical faults in the second semiconductor die (10b); asserting, at a logic circuit (114) of said second semiconductor die (10b), a modulation bypass signal (BP) in response to a fault being detected by the fault detection circuit (118); forcing, at a modulation masking circuit (123) of said second semiconductor die (10b), said modulated signal (FB) to a steady value over a plurality of periods of said carrier signal in response to said modulation bypass signal (BP) being asserted; detecting, at a respective logic circuit (108) of said first semiconductor die (10a), a condition where said modulated signal (FB) has a steady value over a plurality of periods of said carrier signal; and asserting, at said respective logic circuit (108) of said first semiconductor die (10a), a fault detection signal (FAULT) in response to said condition being detected.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
  a first semiconductor die;
  a second semiconductor die galvanically isolated from said first semiconductor die, wherein the second semiconductor die includes a signal modulator circuit configured to modulate a carrier signal to produce a modulated signal encoding information;
  a galvanically isolated communication channel in said first semiconductor die and said second semiconductor die and configured to transmit said modulated signal from the second semiconductor die to the first semiconductor die;

wherein the second semiconductor die includes:
a fault detection circuit configured to detect electrical faults in the second semiconductor die;
a logic circuit coupled to the fault detection circuit and configured to assert a modulation bypass signal in response to a fault being detected by the fault detection circuit; and
modulation masking circuitry configured to force said modulated signal to a steady value over a plurality of periods of said carrier signal in response to said modulation bypass signal being asserted;
and wherein the first semiconductor die includes a respective logic circuit sensitive to said modulated signal and configured to detect a condition where said modulated signal has a steady value over a plurality of periods of said carrier signal, and to assert a fault detection signal in response to said condition being detected.

2. The electronic device of claim 1, wherein said modulation bypass signal is asserted-high, and wherein said modulation masking circuitry comprises:
an inverter circuit configured to produce a complement signal of said modulation bypass signal, and
an AND logic gate configured to combine the complement signal of said modulation bypass signal and said modulated signal to force said modulated signal to a low logic value.

3. The electronic device of claim 1, wherein said modulation bypass signal is asserted-low, and wherein said modulation masking circuitry comprises an AND logic gate configured to combine said modulation bypass signal and said modulated signal to force said modulated signal to a low logic value.

4. The electronic device of claim 1, wherein said modulation bypass signal is asserted-low, and wherein said modulation masking circuitry comprises:
an inverter circuit configured to produce a complement signal of said modulation bypass signal, and
an OR logic gate configured to combine the complement signal of said modulation bypass signal and said modulated signal to force said modulated signal to a high logic value.

5. The electronic device of claim 1, wherein said modulation bypass signal is asserted-high, and wherein said modulation masking circuitry comprises an OR logic gate configured to combine said modulation bypass signal and said modulated signal to force said modulated signal to a high logic value.

6. The electronic device of claim 1, wherein said galvanically isolated communication channel includes:
a transmitter circuit implemented in said second semiconductor die;
at least one isolation capacitor and a receiver circuit implemented in said first semiconductor die; and
electrically conductive means coupling said transmitter circuit to said at least one isolation capacitor.

7. The electronic device of claim 1, wherein the first semiconductor die includes a respective fault detection circuit configured to detect electrical faults in the first semiconductor die, and wherein said respective logic circuit is further configured to assert said fault detection signal in response to a fault being detected by the respective fault detection circuit.

8. The electronic device of claim 1, wherein said carrier signal is modulated according to a pulse-width modulation to produce said modulated signal encoding information.

9. The electronic device of claim 1, wherein said modulation masking circuitry is configured to force said modulated signal to a steady value for a duration of ten or less periods of said carrier signal, preferably five or less periods of said carrier signal, more preferably four periods of said carrier signal, three periods of said carrier signal, or two periods of said carrier signal.

10. The electronic device of claim 1, wherein said modulation masking circuitry is configured to force said modulated signal to a steady value until said fault detection signal is asserted by said respective logic circuit.

11. The electronic device of claim 1, further comprising:
an input node configured to receive a pulse-width modulated control signal; and
a second galvanically isolated communication channel implemented in said first semiconductor die and said second semiconductor die and configured to transmit said pulse-width modulated control signal from the first semiconductor die to the second semiconductor die;
wherein said second semiconductor die includes a driver circuit configured to receive said pulse-width modulated control signal and produce an output switching signal, the driver circuit including a half-bridge circuit arranged between a positive supply voltage pin and a reference supply voltage pin, and
wherein said modulated signal encodes a value of a supply voltage at said positive supply voltage pin.

12. An electronic system, comprising:
a processing unit configured to generate a pulse-width modulated control signal;
an electronic device coupled to the processing unit, the electronic device including:
a first semiconductor die;
a second semiconductor die isolated from the first semiconductor die, the second semiconductor die includes:
a signal modulator circuit configured to modulate a carrier signal to produce a modulated signal encoding information;
a fault detection circuit;
a logic circuit coupled to the fault detection circuit;
a first galvanically isolated communication channel in the first semiconductor die and the second semiconductor die and configured to transmit the modulated signal from the second semiconductor die to the first semiconductor die;
modulation masking circuitry configured to force the modulated signal to a steady value over a plurality of periods of the carrier signal in response to the modulation bypass signal; and
a respective logic circuit in the first semiconductor die, the logic circuit being sensitive to the modulated signal and configured to detect a condition where the modulated signal has a steady value over a plurality of periods of the carrier signal, and to assert a fault detection signal in response to the condition, the electronic device is configured to receive the pulse-width modulated control signal and to transmit the fault detection signal.

13. The electronic system of claim 12, comprising:
an input node configured to receive the pulse-width modulated control signal; and
a second galvanically isolated communication channel in the first semiconductor die and the second semiconductor die and configured to transmit the pulse-width modulated control signal from the first semiconductor die to the second semiconductor die;
the second semiconductor die includes a driver circuit configured to receive the pulse-width modulated control signal and produce an output switching signal, the driver circuit including a half-bridge circuit arranged between a positive supply voltage pin and a reference supply voltage pin, and the modulated signal encodes a value of a supply voltage at the positive supply voltage pin.

14. The electronic system of claim 13, comprising a voltage regulator circuit configured to produce said supply voltage at said positive supply voltage pin.

15. The electronic system of claim 14, comprising a capacitor coupled to said positive supply voltage pin.

16. A method, comprising:

transmitting information in an electronic device that includes a first semiconductor die and a second semiconductor die galvanically isolated from each other, the method comprising:

modulating, at a signal modulator circuit of said second semiconductor die, a carrier signal to produce a modulated signal encoding information;

transmitting said modulated signal from the second semiconductor die to the first semiconductor die via a galvanically isolated communication channel implemented in said first semiconductor die and said second semiconductor die;

detecting, at a fault detection circuit of said second semiconductor die, electrical faults in the second semiconductor die; and asserting, at a logic circuit of said second semiconductor die, a modulation bypass signal in response to a fault being detected by the fault detection circuit.

17. The method of claim 16, comprising forcing, at a modulation masking circuit of said second semiconductor die, said modulated signal to a steady value over a plurality of periods of said carrier signal in response to said modulation bypass signal being asserted.

18. The method of claim 17, comprising: detecting, at a respective logic circuit of said first semiconductor die, a condition where said modulated signal has a steady value over a plurality of periods of said carrier signal.

19. The method of claim 18, comprising asserting, at said respective logic circuit of said first semiconductor die, a fault detection signal in response to said condition being detected.

* * * * *